United States Patent [19]

Pfennings

[11] Patent Number: 4,667,303

[45] Date of Patent: May 19, 1987

[54] DIGITAL INTEGRATED CIRCUIT COMPRISING COMPLEMENTARY FIELD EFFECT TRANSISTORS

[75] Inventor: Leonardus C. M. G. Pfennings, Eindhoven, Netherlands

[73] Assignee: U.S. Philips Corporation, New York, N.Y.

[21] Appl. No.: 600,051

[22] Filed: Apr. 13, 1984

[30] Foreign Application Priority Data

Dec. 22, 1983 [NL] Netherlands .......................... 8304400

[51] Int. Cl.$^4$ ................................................. G06F 7/50
[52] U.S. Cl. ..................................................... 364/784
[58] Field of Search ........................ 364/784, 785, 786; 307/445, 448, 451, 471, 472

[56] References Cited

U.S. PATENT DOCUMENTS

| | | | |
|---|---|---|---|
| 3,878,986 | 4/1975 | Hirasawa | 364/784 |
| 4,042,841 | 8/1977 | Hills et al. | 307/448 |
| 4,471,242 | 9/1984 | Noufer et al. | 307/475 |
| 4,471,454 | 9/1984 | Dearden et al. | 364/786 |

Primary Examiner—David H. Malzahn
Attorney, Agent, or Firm—Thomas A. Briody; Jack Oisher; William J. Streeter

[57] ABSTRACT

Digital integrated C-MOS circuit in which two cross-coupled P-MOS transistors are connected by two separation transistors (N-MOS) to two complementary switching N-MOS transistor logic networks. The gate electrodes of the separation transistor are connected to a reference voltage source. The switching speed of the C-MOS circuit is increased in that (a) the voltage sweep across the logic networks is reduced; (b) each P-MOS transistor, which is connected by a separation transistor to a junction of the logic network to be charged, is slightly conducting and so is "ready" to charge such junction, and (c) the separation transistor between the fully conducting P-MOS transistor and the junction to be discharged in the second logic network constitutes a high impedance which prevents the conducting P-MOS transistor from charging that junction.

6 Claims, 9 Drawing Figures

} a

} b

DIGITAL INTEGRATED CIRCUIT COMPRISING COMPLEMENTARY FIELD EFFECT TRANSISTORS

BACKGROUND OF THE INVENTION

1. Field of the Invention

The invention relates to a digital integrated circuit comprising insulated gate field effect transistors, in which a first and a second transistor of a first conductivity type are connected on the one hand to a first feeding connection point and on the other hand to a first and a second junction, respectively, the gate electrodes of the first and of the second transistor being connected to the second and the first junction, respectively, while between a second feeding connection point and the first and the second junction, respectively, there is connected a first and a second network, respectively, of series- and/or parallel-connected transistors of the second conductivity type, whose gate electrodes receive complementary gate signals so that signal levels which are complementary to each other are produced at the first and at the second junction, respectively.

2. Description of the Related Art

In the foregoing, the term "complementary signals" includes the following: of each (gate-, output) signal which can assume a positive level of "0" (low) or "1" (high), at the same instant the complement is present as (gate-, output) signal "1" (high) or "0" (low). Such a circuit is known from Japanese Kokai No. 55-97734 published on July 25, 1980. The transistors of the first or second type are mostly P- or N-MOS transistors because then the number of P-MOS transistors is limited, as a result of which the semiconductor substrate surface area required for the circuit can also be kept limited. For the same current/voltage behaviour a P-MOS transistor requires a surface area three times larger than an N-MOS transistor because the latter has a value $\beta$ which is three times larger.

In principle, the circuit may be any type of logic circuit, such as a gate circuit, arithmetic circuits (inter alia full adders), decoder circuits etc.

SUMMARY OF THE INVENTION

The invention has for its object to provide a digital integrated circuit of the kind mentioned in the opening paragraph, which has a substantially higher switching speed than the circuit according to the prior art.

A digital integrated circuit according to the invention is therefore characterized in that the first and the second transistors of the first conductivity type are connected via a third and a fourth transistor, respectively, of the second conductivity type to the first and the second junction, respectively, the gate electrodes being connected to each other and being connected to a reference voltage source, while the junctions between the first and the third transistor and between the second and the fourth transistor constitute a first and a second output junction, respectively, at which signals are formed which are complementary to each other.

By the use of separation transistors, whose gate electrodes receive a reference voltage, between the output junctions and the junctions to which the logic networks are connected, only the output junctions need perform the complete logic sweep: of "1" (high) to "0" (low) (for example from 5 V to 0 V) and conversely, whereby the junctions at which the logic networks of transistors of the second conductivity type need perform a considerably smaller voltage sweep (if, for example, the reference voltage is 3.5 V and the threshold voltage of the separation transistors is 1 V, the voltage sweep is 2.5 V instead of 5 V). Consequently, the gate electrodes of the transistors of the first conductivity type will receive a gate voltage which varies between $-5$ and $-2.5$ V instead of between $-5$ and 0 V.

Due to the lower gate voltage ($-2.5$ V instead of $-5$ V) at the gate electrode of the cut-off transistor (P-MOS), the latter is nevertheless slightly conducting. Thus, this transistor will be effectively ready to provide a junction to be charged with charge. Furthermore, the separation transistor (third or fourth transistor) has a high impedance so that the fully conducting P-MOS transistor is impeded in recharging the junction which should be discharged via the network connected to it. Due to these three effects described above, the circuit can be switched at a substantially higher speed.

BRIEF DESCRIPTION OF THE DRAWINGS

The invention will now be described more fully with reference to embodiments not limiting the invention shown in the drawing, in which.

DESCRIPTION OF THE PREFERRED EMBODIMENTS

Figure 1:
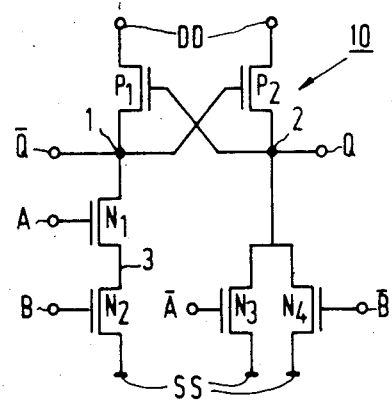
FIG. 1 shows a circuit according to the prior art.

FIG. 1 shows a prior art digital complementary circuit in the form of an AND gate 10, which comprises two cross-coupled field effect transistors P1 and P2, respectively, of a first conductivity type, such as P-MOS, which are respectively connected between a supply voltage terminal DD and a first junction 1 and 2, respectively. The circuit 10 further comprises a first and a second logic network I and II of field effect transistors (N1, N2, N3, N4) of the second conductivity type (N-MOS). The first and the second networks I and II are respectively connected between the first and the second junction 1 and 2, respectively, and a second supply terminal SS. The first supply terminal DD receives a supply voltage $V_{DD}$ (for example 5 V) and the second supply voltage terminal SS receives a supply voltage $V_{SS}$ (for example 0 V). The logic network insulated gate electrodes of the transistors N1, N2, N3 and N4 receive the gate signals A, B, $\overline{A}$ and $\overline{B}$, respectively, the gate signals $\overline{A}$ and $\overline{B}$ being the complementary (logic inverted) signals of the gate signals A and B, which means that, if the signals A and B are logically "1" (high), the signals $\overline{A}$ and $\overline{B}$ are logically "0" (low). The voltage levels of the values logic "1" and "0" are, for example, 5 V and 0 V.

Let it be assumed that the gate signals A and B are both logically "1" (the gate signals $\overline{A}$ and $\overline{B}$ are therefore logically "0"). The logic network transistors N1 and N2 are conducting and consequently the junction 1 has a logic "0" level, like a junction 3, which is the junction between the transistors N1 and N2. The junction 2 has a logic "1" level because the transistors N3 and N4 are in the cut-off condition and the switching transistor P2 is conducting (junction 1 is logically "0"). The switching transistor P1 becomes cut off because the junction 2 has a logic "1" level.

When the gate signal B passes from logic "1" to logic "0" ($\bar{B}$ passes from "0" to "1"), the transistor N2 will become cut off and the transistor N4 will become conducting. The junction 1 will now have a floating potential logic "0" and the junction 2 will have a potential which decreases from the logic level "1" because the transistor N4 is conducting. As soon as the potential at the junction 2 falls below the threshold voltage of the transistor P1, the switching transistor P1 will become conducting. As a result, charge is supplied to the junction 1 so that the switching transistor P2 will conduct less current. This results in that the junction 2 will be discharged at an increasingly higher speed and that the junction 1 is charged at an increasingly higher speed until ultimately the condition is reached that the switching transistor P2 is fully cut off and that the switching transistor P1 is fully conducting. The junction 1 has a "high" level (logic "1") and the junction 2 has a "low" level (logic "0"). The switching speed of the logic C-MOS transistor circuit is few nanoseconds. The switching speed is limited by the diffusion and wiring capacitances present in the circuit and also by the load capacitances of the transistors of a succeeding circuit (not shown) to be connected to the circuit 10 to be controlled by the output signals Q and $\bar{Q}$ (at the output junctions 2 and 1). It is clear that as the complexity of the complementarily acting logic networks I and II increases (number of transistors increases), the number of the said capacitances and the value of certain capacitances (for example the junction) will also increase. Thus, the switching speed is substantially limited.

Figure 2A:
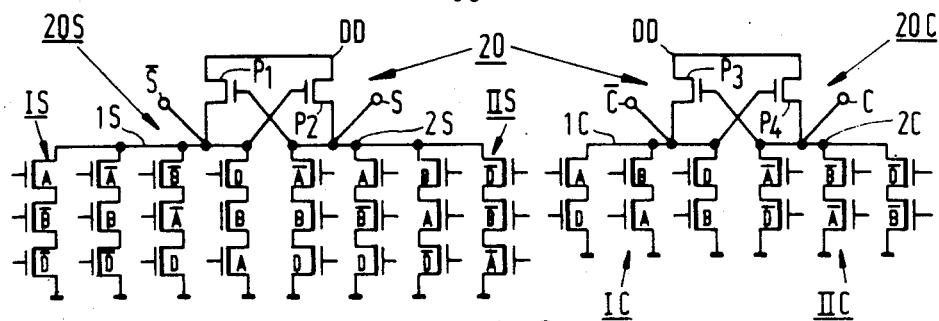
FIGS. 2a and b show a similar kind of circuits; however, in FIG. 2b the load capacitances, the diffusion and wiring capacitances are indicated.

FIG. 2a shows a full adder 20, which comprises a summing section 20S and a "carry" section 20C. Each section 20S and 20C is essentially composed in the same manner as the circuit 10 (AND gate, which also supplies the inverted $\overline{AND}$ signal) and so comprises two cross-coupled switching transistors P1, P2, P3 and P4 of a first conductivity type (P-MOS transistors) and logic networks IS, IC, IIS, IIC of transistors of the second conductivity type (N-MOS transistors) connected to the switching transistors P1 to P4. The subcircuits 20S and 20C are connected between two supply voltage terminals DD and SS. Gate electrodes of the transistors of the logic networks IS, IC, IIS and IIC have supplied to them input signals A, $\bar{A}$, B, $\bar{B}$ and D, $\bar{D}$, of which A and B are two units (0 or 1) to be added of two binary numbers and D is, for example, a carry signal (0 or 1) of a preceding full adder. The summing section 20S forms at two output junctions 1S and 2S the inverted summing signal $\bar{S}$ and the summing signal S, which can be carried to a next circuit in an integrated circuit arrangement or to an output terminal of the integrated circuit arrangement. The subcircuit 20C forms at the junction 1C and 2C the inverted carry signal $\bar{C}$ and the carry signal C. Both signals C and $\bar{C}$ can be carried to a next full adder circuit, in which the units lying above A and B are added and/or at least one of the two signals C or $\bar{C}$ can be carried to an output terminal of the integrated circuit arrangement.

Figure 2B:
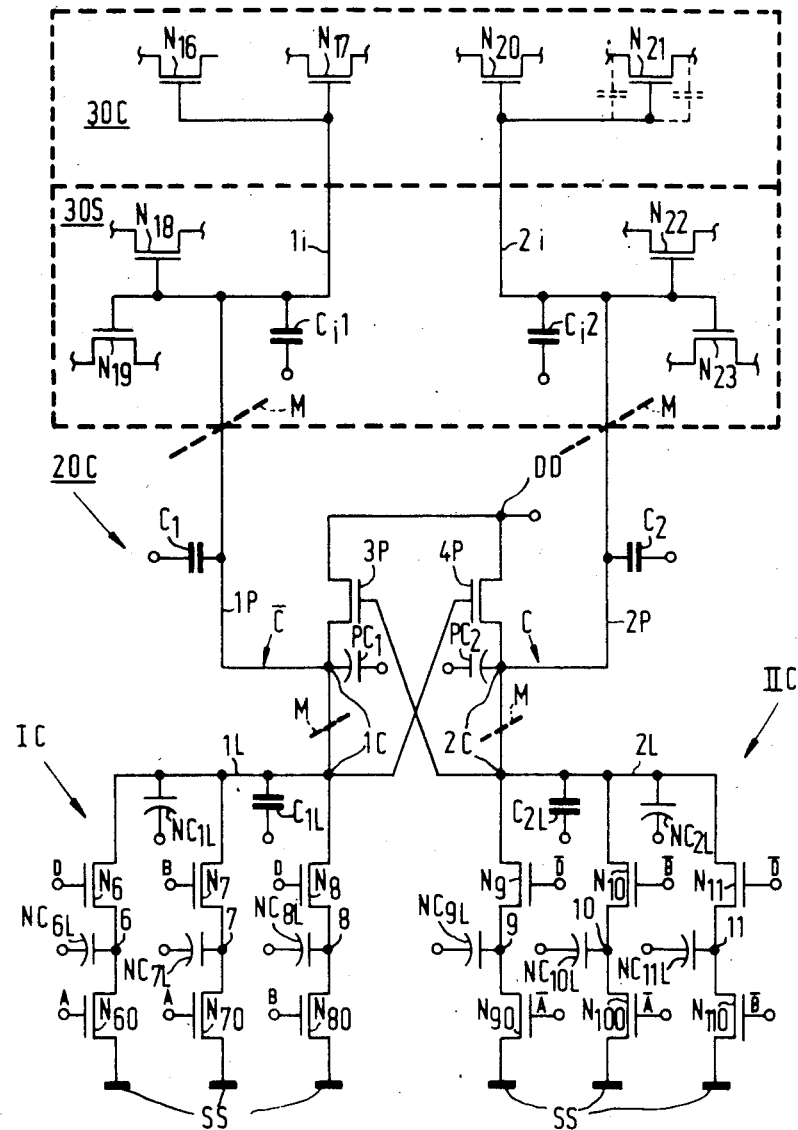

FIG. 2b again shows the carry section 20C of the circuit 20 of FIG. 2a, in which the load, diffusion and wiring capacitances are indicated. The reference numberals and symbols used in FIG. 2b correspond to the reference numerals and symbols used in FIG. 2a. The junctions 1C and 2C are each subdivided into three parts, which in the Figure are separated symbolically by oblique broken lines M. A first part 1L and 2L belongs to the logic network 1C and IIC. A second part 1i and 2i belongs to the input of a next full adder circuit which comprises a summing section 30S and a carry section 30C. The remaining third part 1P and 2P is that part of the junction 1C and 2C in which are situated the diffusion capacitances $PC_1$ and $PC_2$ of the P-MOS transistors P with the associated wiring capacitances $C_1$ and $C_2$. In the first part 1L and 2L diffusion capacitances are provided with a reference symbol with a subscript to the associated junctions; thus, $NC_{2L}$ designates the overall $N^+$ diffusion capacitance to the substrate of all the source/drain regions which are connected to the junction part 2L. Further, reference numeral $C_{2L}$ denotes the parasitic capacitance of the junction part 2L due to the associated wiring. The N-MOS transistors in the logic networks are provided with a reference symbol N with a subscript number. The junction formed between two transistors (for example N8 and N80) has the same subscript number and exhibits a parasitic capacitance (diffusion capacitance) which is designated in an analogous manner to that indicated above by the same reference (so in the example by $NC_{8L}$).

The load capacitances $C_{1i}$ and $C_{2i}$ present in the second part 1i and 2i are constituted inter alia by the gate electrodes of the transistors N16 to N23 to be controlled by the carry section 20C. It is clear that these capacitances $C_{1i}$ and $C_{2i}$ are inevitable and that their value is determined by the number of transistors N16 to N23 to be controlled.

The said wiring, diffusion and load capacitances shown in the Figure are (i.e. at least in part) continuously charged or discharged via one of the P-MOS transistors P or a few of the N-MOS transistors N, which renders the circuit slow in operation (and gives rise to dynamic dissipation).

Figure 3:
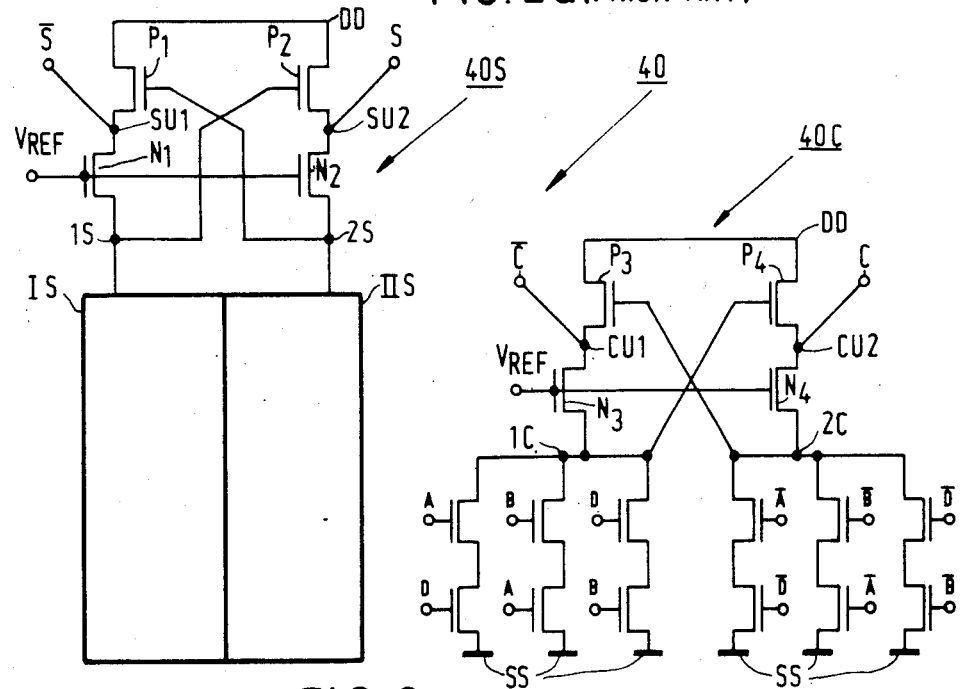
FIG. 3 shows a circuit according to the invention.

FIG. 3 shows a circuit 40 according to the invention. The circuit 40 is a full adder circuit comprising a summing section 40S and a carry section 40C. The circuit shown in FIG. 3 corresponds to the circuit 10 shown in FIG. 1 except that there is arranged between each switching transistor P1, P2, P3, P4 of the first conductivity type (P-MOS transistors) and the logic networks IS, IIS and IC, IIC a separation transistor N1, N2, N3, N4 of the second conductivity type (N-MOS), whose gate electrodes are kept at a reference potential $V_{ref}$. It should be noted that the gate electrodes of the transistors P1, P2, P3, P4 remain connected to the junctions 1S, 2S and 1C, 2C and that the connections between the transistors P1, P2, P3 and P4 and the separation transistors N1, N2, N3, N4 constitute output junction SU1, SU2 and CU1, CU2, respectively. Inter alia from the output junctions CU1, CU2 the adder circuit of a next stage is now controlled (see FIG. 2b). By the aforementioned measure it is achieved that the second and the third parts 1i, 2i and 1P, 2P are decoupled from the first parts 1L and 2L. If now a switching action takes place in the subcircuits 40S and 40C, the parts 1i and 2i and 1P and 2P will perform a full voltage sweep (of $\approx V_{DD}$ to $V_{SS}$ or conversely), while the parasitic capacitive load of the subjunctions 1L and 2L perform only a voltage sweep of the order of $V_{ref}-V_{SS}-V_{TH}$, $V_{TH}$ representing the threshold voltage of the N-MOS separation transistors N1, N2, N3, N4. If $V_{DD}$ (the supply voltage at the terminal DD) is 5 V, where $V_{SS}$, $V_{ref}$ and $V_{TH}$ have the values 0, 3.5 and 1 V, respectively, the voltage at the subjunctions 1L and 2L (likewise 1S and 2S) will be 2.5 or 0 V. By the use of the separation transistors N1, 2, 3, 4 it is thus achieved: that the voltage sweep at the junctions 1S, 2S, 1C and 2C is reduced; that the conducting P-MOS transistors P1 or P2, P3 or P4 prevent a junction 1S or 2S, 1C or 2C from being recharged, because the separation transistor N1 or N2, N3 or N4 forms a high impedance; and that the cut-off P-MOS transistor P2 or P1, P3 or P4 is not entirely in the cut-off condition (the voltage at the gate electrode is −2.5 V instead of −5 V), as a result of which the latter is in fact "ready" to charge a junction S2 or S1, C2 or C1 to be charged via the separation transistor N2 or N1, N4 or N3. The three aforementioned effects are attained by taking a single measure (inserting the separation transistors (N1, N2, N3, N4).

The circuit according to the invention will operate satisfactorily especially if the width/length ratio (W/L ratio) of the separation transistors N1, N2, N3, N4 is adapted in such a manner to the width/length ratio of the transistors in the logic networks that the series-connected (conducting) transistors in one logic network have a lower impedance than the (conducting) separation transistors. In other words, the foregoing means that the width/length ratio of the third and fourth transistors (N1, N2, N3, N4) should be smaller than a resulting width/length ratio of the series- and/or parallel-connected transistors in the first and second logic network IS, IIS and IC, IIC, respectively, connected to the third and the fourth transistor N1, N2 and N3, N4 respectively.

It should be noted that the transistors P1, P2, P3, P4 are now controlled by voltages lying between −4.8 V and −2.5 V instead of between −5 V and 0 V. Consequently, a switching transistor which is to be switched off will receive a gate voltage of −2.5 V instead of 0 V and so will not be cut off entirely, which will give rise to some dissipation. However, via the same transistor the first part of the junction 1S or 2S or 1C or 2C to be charged will be charged more rapidly. By choosing the value of the reference voltage $V_{ref}$, the static dissipation can be chosen larger or smaller, the switching speed becoming lower in the latter case. Thus, limitation of static dissipation can be exchanged for switching speed. It should be noted that the circuit can also be switched off, in which event (substantially) no dissipation occurs when the reference voltage $V_{ref}$ is increased to 5 V.

In an advantageous embodiment of the circuit 40 according to the invention, in which the circuit 40 is a first part of an integrated circuit arrangement (see FIG. 2b), the output junction 1P, 2P are connected to input junctions 1i, 2i of another part 30S, 30C of the circuit, the first, second, third and fourth transistors P3, P4, N3 and N4 of the circuit 40 are arranged substantially immediately at the input junctions 1i, 2i, as a result of which the wiring capacitance C1, C2 of the connection between the junctions 1P, 2P and 1i, 2i remains limited to a minimum (see FIG. 2b), which has a positive influence on the switching speed because a smaller capacitance need be charged or discharged. It is to be noted that there exists across these capacitances a voltage sweep of 5 V and that these capacitances have to be discharged via the third or fourth transistor N3, N4 and the first or second network IC, IIC. The logic networks IC, IIC can be arranged at a substantial distance from the first, second, third and fourth transistors P3, P4, N3, N4 (at the area inside the integrated circuit at which a suitable space is available for them). The wiring capacitances C1L, C2L of the connections between the first and second junction 1S, 2S, 1C, 2C and the logic networks IS, IIS, IC, IIC play a considerably less important part. In the first place, the voltage sweep across these capacitances C1L, C2L is reduced to (about) half the value (from 5 to 2.5 V) and furthermore these wiring capacitances C1L, C2L can be discharged more rapidly because they are discharged only via the logic networks. Especially if the connection between the third and fourth transistor N3, N4 (in other words between the first and the second junction 1S, 2S, 1C, 2C respectively) and the first and the second logic network IS, IIS and IC, IIC, respectively, are formed from metal (alu tracks) (instead of from polycrystalline silicon), the connection itself will not impede the discharge of the parasitic (wiring) capacitance because of the occurring low ohmic resistance thereof.

Since the voltage sweep across the transistors N16 to N23 in the summing section 30S and in the carry section 30C is only ≈2.5 V (instead of 5 V) and the voltage sweep at the gate electrodes thereof is 5 V, the Miller effect will be smaller due to the overlap capacitances of the N-MOS transistors N16 to N23 to be controlled. Furthermore, a shorter channel length is sufficient for the transistors N16 to N23 because at most 2.5 V can be applied across each transistor N16 to N23. Of course, the foregoing applies to all N-MOS transistors in the logic networks IS, IIS, IC and IIC.

Figure 4:
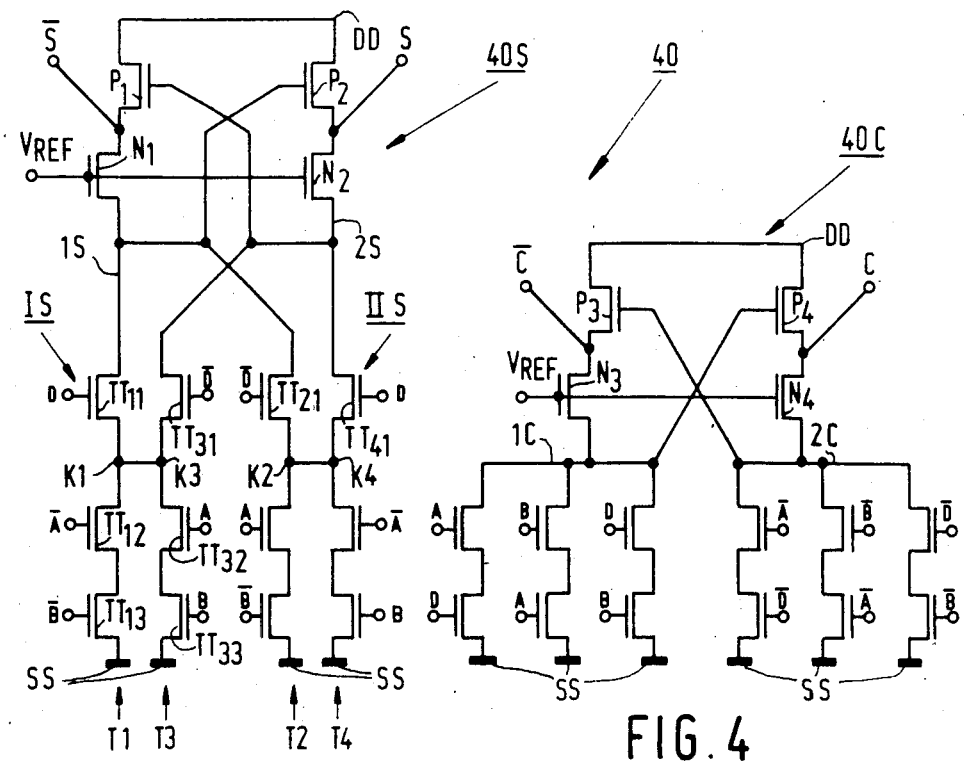
FIG. 4 shows an embodiment of a circuit according to the invention.

In order to increase the switching speed of the circuit shown in FIG. 2a, it is alternatively possible to limit the number of transistors in the logic networks IS and IIS to a minimum. Such a circuit is shown in FIG. 4, in which separation transistors N1 and N2 according to the invention are also utilized. Instead of the 24 N-MOS transistors in the logic networks IS and IIS used in FIG. 2a, only 12 N-MOS transistors are required in the circuit shown in FIG. 4. The reduction of the number of transistors leads to a reduction of wiring and diffusion capacitances, which is advantageous and has a positive effect on the switching speed. It should be noted that in FIG. 4 the same reference numerals are used for the corresponding parts as in FIG. 2a.

The logic networks IS and IIS of the summing section 40S each comprise two parallel branches T1, T2 and T3, T4, which each comprise a series arrangement of transistors TT11 to TT13, TT21 ... TT41 to TT43. A junction K1, K2 of a first transistor TT11, TT21 with a second transistor TT12, TT22 in a first or second branch T1, T2 of the first network IS is connected to a junction K3, K4 of a first transistor TT31, TT41 with a second transistor TT32, TT42 in a first or second branch T3, T4 of the second network IIS. The first transistors TT11, TT21, TT31, TT41 of the second branches of the first or second network IS, IIS are connected to the first or second junction 1S, 2S.

Figure 5:
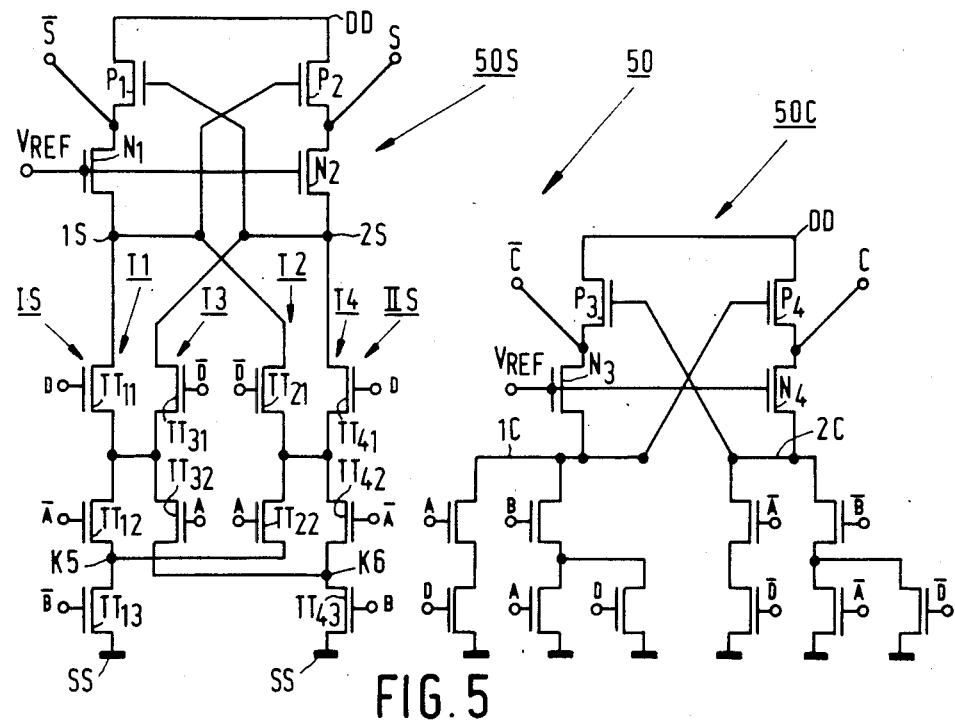
FIG. 5 shows a preferred embodiment of a circuit according to the invention.

A further reduction of the number of transistors in the logic networks IS, IIS and IC, IIC is shown in FIG. 5. In contrast to FIG. 4 in which in all networks IS, IIS and IC, IIC of the summing sections 50S and the carry section 50C the transistors are connected pairwise to the feeding connection point SS and receive at their electrodes the same gate signal, in FIG. 5 certain pairs of transistors are replaced by a single transistor. This results in that in the summing section 50S the branches T1 and T4 are identical to the branches T1 and T4 of FIG.

4 but the branches T2 and T3 each comprise only two transistors TT21, TT22, TT31 and TT32, of which the second transistor TT22, TT32 is invariably connected to the junction K5, K6 between the second and the third transistor TT12, TT13, TT42, TT43 in the first and fourth branch T1, T4. In the carry section 50C two junctions between two transistors connected in series in a branch (FIG. 4) in a logic network IC, IIC are connected to each other, as a result of which one of the two transistors in these two branches, which receive the same gate signal, can be dispensed with. The result is that in the summing section 50S the number of transistors in the logic networks IS and IIS is reduced to 10 and that in the carry section 50C the number of transistors in the logic networks IC and IIC is reduced to 10, which is advantageous. An additional advantage of this reduction is that the load capacitance of a full adder is reduced for a preceding circuit because the number of transistors to be controlled by the carry signals C and $\overline{C}$ (i.e. the input signals D and $\overline{D}$ for the next stage) is only three instead of four.

Figure 6:
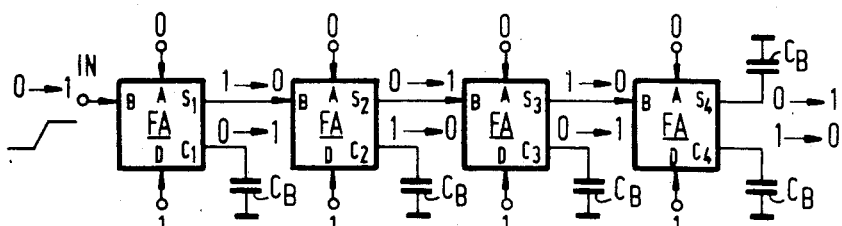
FIG. 6 shows diagrammatically a cascade arrangement of circuits according to the invention, and FIGS. 7a and b show time diagrams of the cascade arrangement shown in FIG. 6.

FIG. 6 shows a cascade arrangement of four full adders FA, with which the gain in switching speed obtained by the use of the separation transistors is verified. All "A" inputs receive a gate signal "0". All "D" inputs, which normally receive the carry signal of the preceding full adder, receive a gate signal "1". The summing outputs "S" ("$\overline{S}$") are connected to the "B" ("$\overline{B}$") inputs of the next full adder. The carry outputs "C" ("$\overline{C}$") (like the summing output S4) are connected to earth via a capacitance $C_B$ (which corresponds to the normal load capacitance C2i (C1i, see FIG. 2b).

Figure 7:
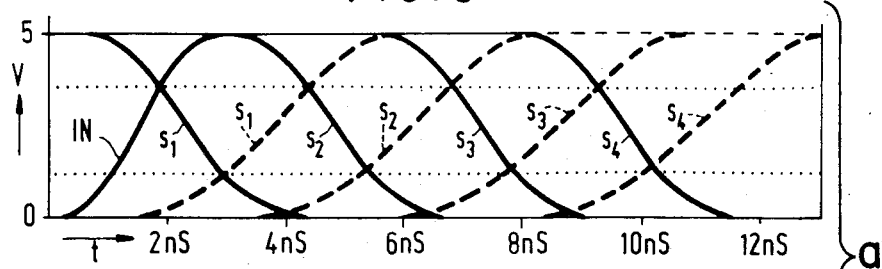
Figure 7:
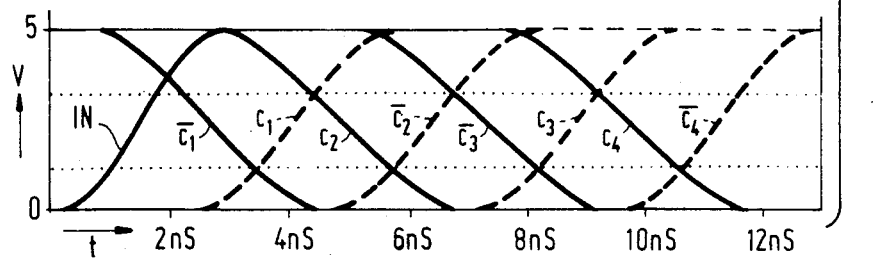
Figure 7:
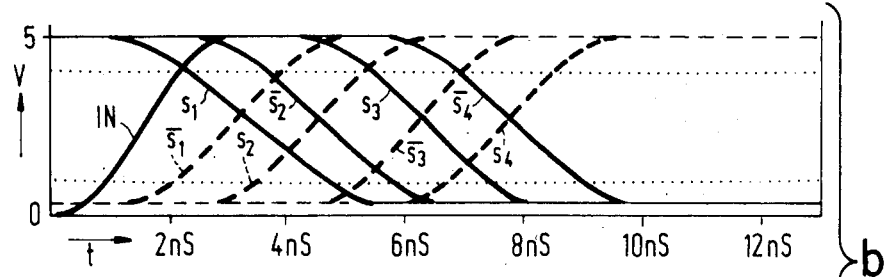
Figure 7:
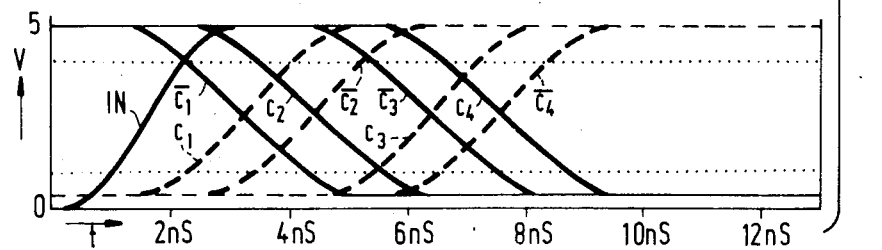

FIGS. 7a and 7b show time-voltage diagrams of signals as present in the cascade arrangement of FIG. 6, both for the case a, in which in each full adder circuit of the kind shown in FIG. 4 the separation transistors N1, 2, 3, 4 are omitted, and for the case b, in which the circuit of the kind shown in FIG. 4 is connected in cascade. In FIGS. 7a and b, the diagrams indicated pairwise illustrate the input signal IN and the occurring summing signals S1, S2, S3 and S4 and their inverse values $\overline{S1}$, $\overline{S2}$, $\overline{S3}$, $\overline{S4}$ as a function of time, just like the carry signals C1, C2, C3, C4 and their inverse values $\overline{C1}$, $\overline{C2}$, $\overline{C3}$, $\overline{C4}$. If in the absence of the separation transistors N1, 2, 3, 4 the switching time is on an average 2.6 nanoseconds, with the use of the separation transistors N1, 2, 3, 4 with a threshold voltage $V_{TH}=1$ V and with a reference voltage $V_{ref}=3.5$ V the average switching time will be 1.6 nanoseconds, as can be estimated from FIG. 7b.

It should be noted that the switching speed can be further increased in that, as already indicated, short-channel transistors can be used in the logic networks, which is possible due to the fact that the voltage drop across each logic network is reduced.

What is claimed is:

1. In a digital integrated circuit comprising a plurality of insulated gate field effect transistors (IGFETs) and having a pair of supply voltage terminals and a pair of output terminals, the improvement consisting of:
   first and second switching IGFETs (IGFETs 1 and 2) of a first conductivity type, the source-drain paths of which are respectively connected between one of said supply voltage terminals and a first and second of said output terminals, respectively;
   first and second logic circuits respectively comprising a plurality of IGFETs of a second conductivity type, said first logic circuit being connected between the other of said supply voltage terminals and the gate electrode of switching IGFET 2 and said second logic network being connected between said other supply voltage terminal and the gate electrode of switching IGFET 1; the gate electrodes of the IGFETs in said first and second logic networks receiving complementary logic signals, whereby complementary logic signals are supplied by said first and second logic networks to the gate electrodes of switching IGFET 2 and switching IGFET 1, respectively;
   first and second IGFETs (IGFETs 3 and 4) of said second conductivity type respectively connecting said first and second logic circuits to said first and second output terminals, respectively;
   and means for supplying a substantially constant reference voltage which is less than said supply voltage to the gate electrodes of IGFETs 3 and 4;
   whereby the voltage sweep of the logic signals supplied to the gate electrodes of switching IGFETs 1 and 2 in response to the logic signals received by said first and second logic networks are reduced by an amount equal to said reference voltage, and complementary output signals are produced at said first and second output terminals in response to said received logic signals.

2. A digital integrated circuit as claimed in claim 1, characterized in that the width/length ratios of the channels of IGFET 3 and IGFET 4 are respectively smaller than such ratios for any of the IGFETs in said first and second logic networks, respectively.

3. A digital integrated circuit as claimed in claim 1, characterized in that the reference voltage supplied to the gate electrodes of IGFETs 3 and 4 is adjustable to any of at least two voltage levels.

4. A digital integrated circuit as claimed in claim 1, 2 or 3, wherein the output signals produced at said first and second output terminals constitute summations of the logic signals received by said first and second logic networks, and wherein:
   said first and second logic networks each comprise first and second parallel branches of three series-connected IGFETs in each branch, the junction between the first and second IGFETs (IGFETs 5 and 6) in the first branch of the first logic network being connected to the junction between the first and second IGFETs (IGFETs 7 and 8) in the second branch of the first logic network, and the junction between the first and second IGFETs (IGFETs 9 and 10) in the first branch of the second logic network being connected to the junction between the first and second IGFETs (IGFETs 11 and 12) in the second branch of the second logic network;
   the source-drain paths of IGFETs 5 and 9 are connected to IGFET 3 and the source-drain paths of IGFETs 7 and 11 are connected to IGFET 4;
   the successive IGFETs in the first branch of each of said logic networks receiving gate signals which are complementary to the gate signals received by the corresponding IGFETs in the second branch of the same logic network.

5. A digital integrated circuit as claimed in claim 1, 2 or 3, wherein the output signals produced at said first and second output terminals constitute summations of the logic signals received by said first and second logic networks, and wherein:

said first and second logic networks each comprise first and second parallel branches of two series-connected IGFETs in each branch, the junction between the first and second IGFETs (IGFETs 5 and 6) in the first branch of the first logic network being connected to the junction between the first and second IGFETs (IGFETs 7 and 8) in the second branch of the first logic network, and the junction between the first and second IGFETs (IGFETs 9 and 10) in the first branch of the second logic network being connected to the junction between the first and second IGFETs (IGFETs 11 and 12) in the second branch of the second logic network;

the source-drain paths of IGFETs 5 and 9 are connected to IGFET 3 and the source-drain paths of IGFETs 7 and 11 are connected to IGFET 4;

the gate electrodes of the successive IGFETs in the first branch of each of said logic networks receive logic signals which are complementary to the logic signals received by the gate electrodes of the corresponding IGFETs in the second branch of the same logic network; and the first branch of the first logic network further comprises a third IGFET (IGFET 13) series-connected therein and the second branch of the second logic network further comprises a third IGFET (IGFET 14) series-connected therein, the gate electrodes of IGFETs 13 and IGFET 14 receiving complementary logic signals.

6. A digital integrated circuit as claimed in claim 1, 2 or 3, wherein the output signals produced at said first and second output terminals constitute carries of summations of the logic signals received by said first and second logic networks, and wherein:

said first and second logic networks each comprise first and second parallel branches of two series-connected IGFETs in each branch, the logic signals received by the gate electrodes of the first and second transistors in the first and second branches of the first logic network being complementary to the logic signals received by the gate electrodes of the corresponding IGFETs in the first and second branches, respectively, of the second logic network; and a further IGFET (IGFET 5) is connected in parallel with the second IGFET in the second branch of the first logic network and a further IGFET (IGFET 6) is connected in parallel with the second IGFET in the second branch of the second logic network, the gate electrodes of IGFETs 5 and 6 receiving complementary logic signals.

* * * * *